(12) United States Patent
Tucker et al.

(10) Patent No.: US 6,327,148 B1
(45) Date of Patent: Dec. 4, 2001

(54) HEATSINK FOR ACTIVELY COOLED DAUGHTERBOARD SYSTEM

(75) Inventors: Sean W Tucker, Loveland; Kristina L Mann, Fort Collins; Donald Trotter, Loveland; Andrew D Delano, Ft. Collins, all of CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/606,470

(22) Filed: Jun. 29, 2000

(51) Int. Cl.[7] ........................................ H05R 7/20
(52) U.S. Cl. .................. 361/704; 361/690; 361/694; 361/695; 361/707; 361/719; 257/718; 257/719; 257/721; 174/16.1; 174/16.3; 165/80.3; 165/185
(58) Field of Search ..................... 361/688–690, 361/694, 695, 697, 703, 704, 709, 710; 165/80.3, 185; 174/16.3; 257/712, 713, 717, 719, 721, 722

(56) References Cited

U.S. PATENT DOCUMENTS

| | | | |
|---|---|---|---|
| 5,828,551 | * 10/1998 | Hoshino et al. | 361/695 |
| 5,982,622 | * 11/1999 | Chiou | 361/704 |
| 6,064,574 | * 5/2000 | Yu et al. | 361/704 |
| 6,097,601 | * 8/2000 | Lee | 361/704 |
| 6,101,091 | * 8/2000 | Baik | 361/704 |
| 6,141,220 | * 10/2000 | Lin | 361/704 |

* cited by examiner

*Primary Examiner*—Leo P. Picard
*Assistant Examiner*—Boris L. Chervinsky
(74) *Attorney, Agent, or Firm*—Kevin M. Hart

(57) ABSTRACT

A heatsink for use with an actively cooled daughterboard system. Plural transverse fins are integrally formed with a base portion. The fins are parallel to one another and orthogonal to the bottom of the base portion. The fins have a constant profile relative to the bottom of the base portion, but the base portion has a central portion that is thicker than its end portions. The thickness of the central portion varies according to a radius. The radius is approximated by step differences in the depths of the fins.

9 Claims, 8 Drawing Sheets

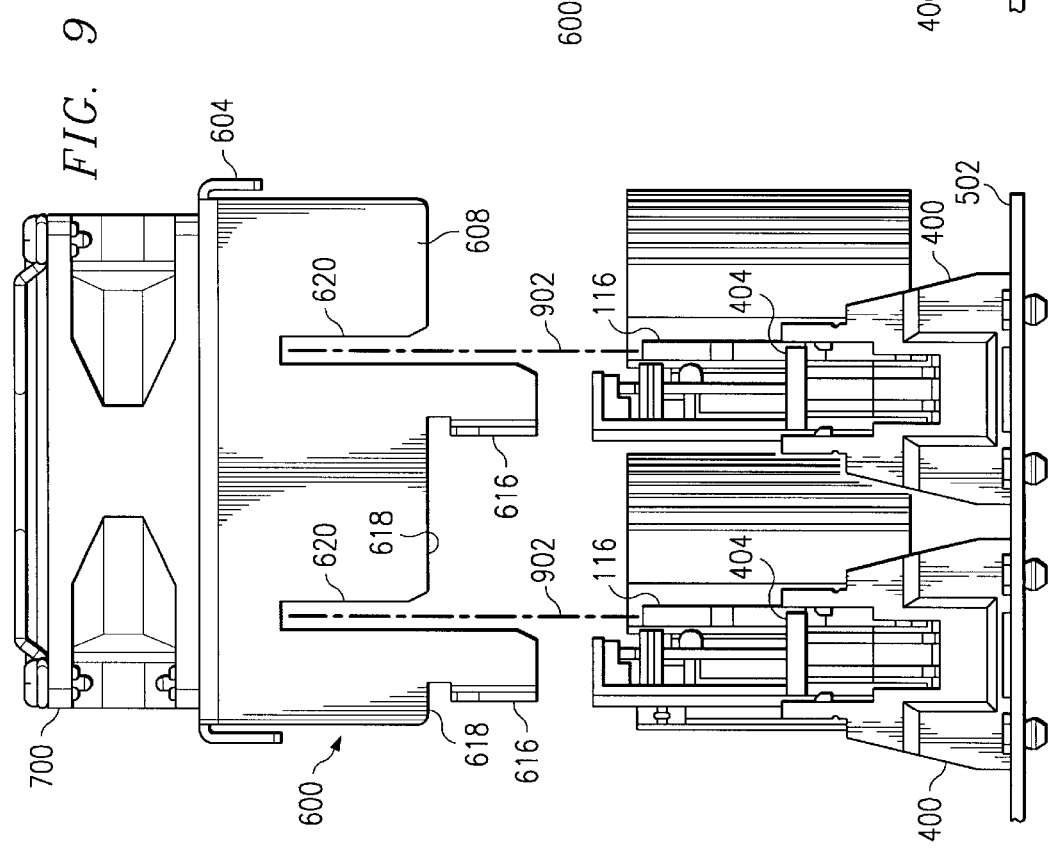

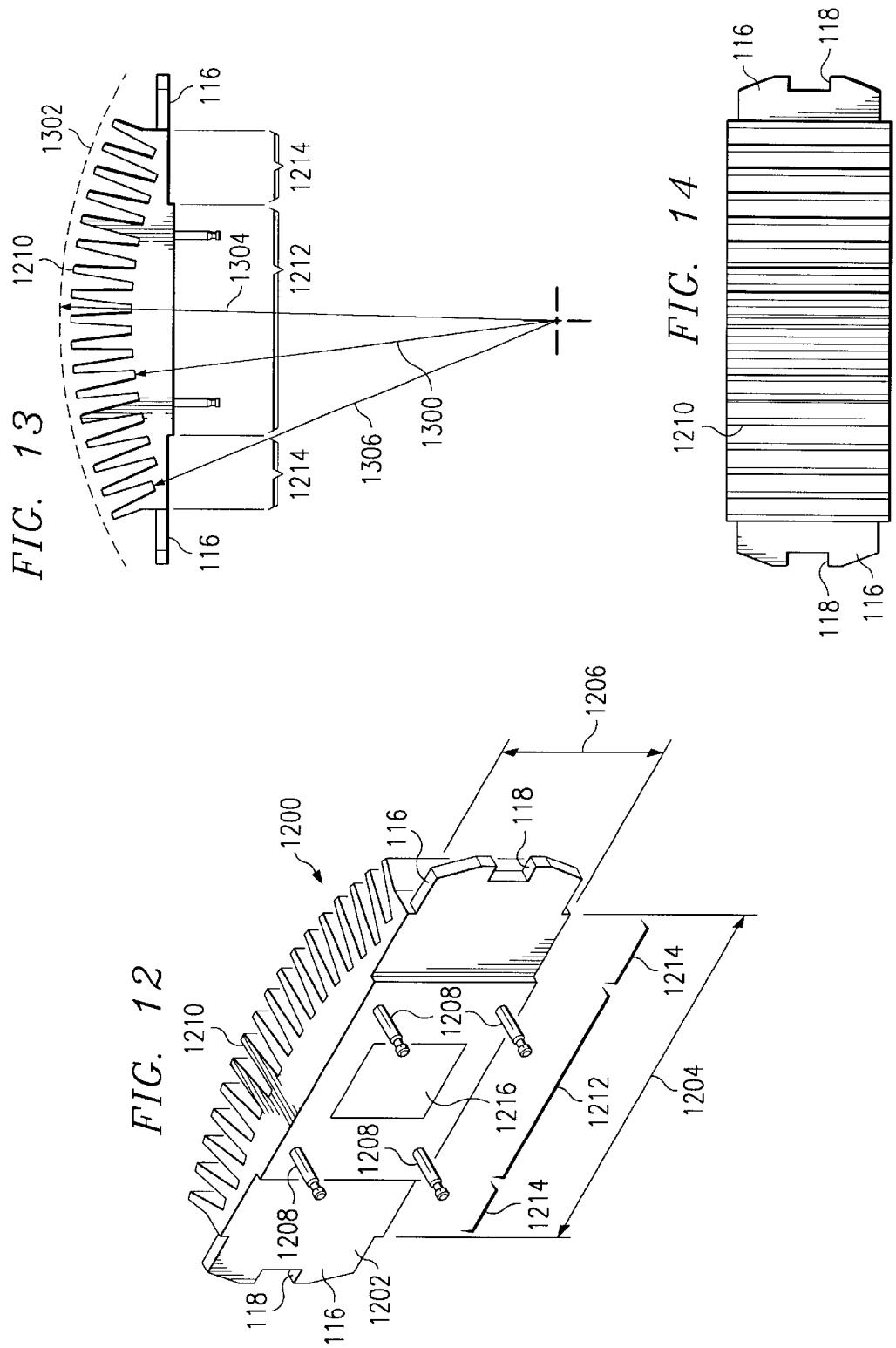

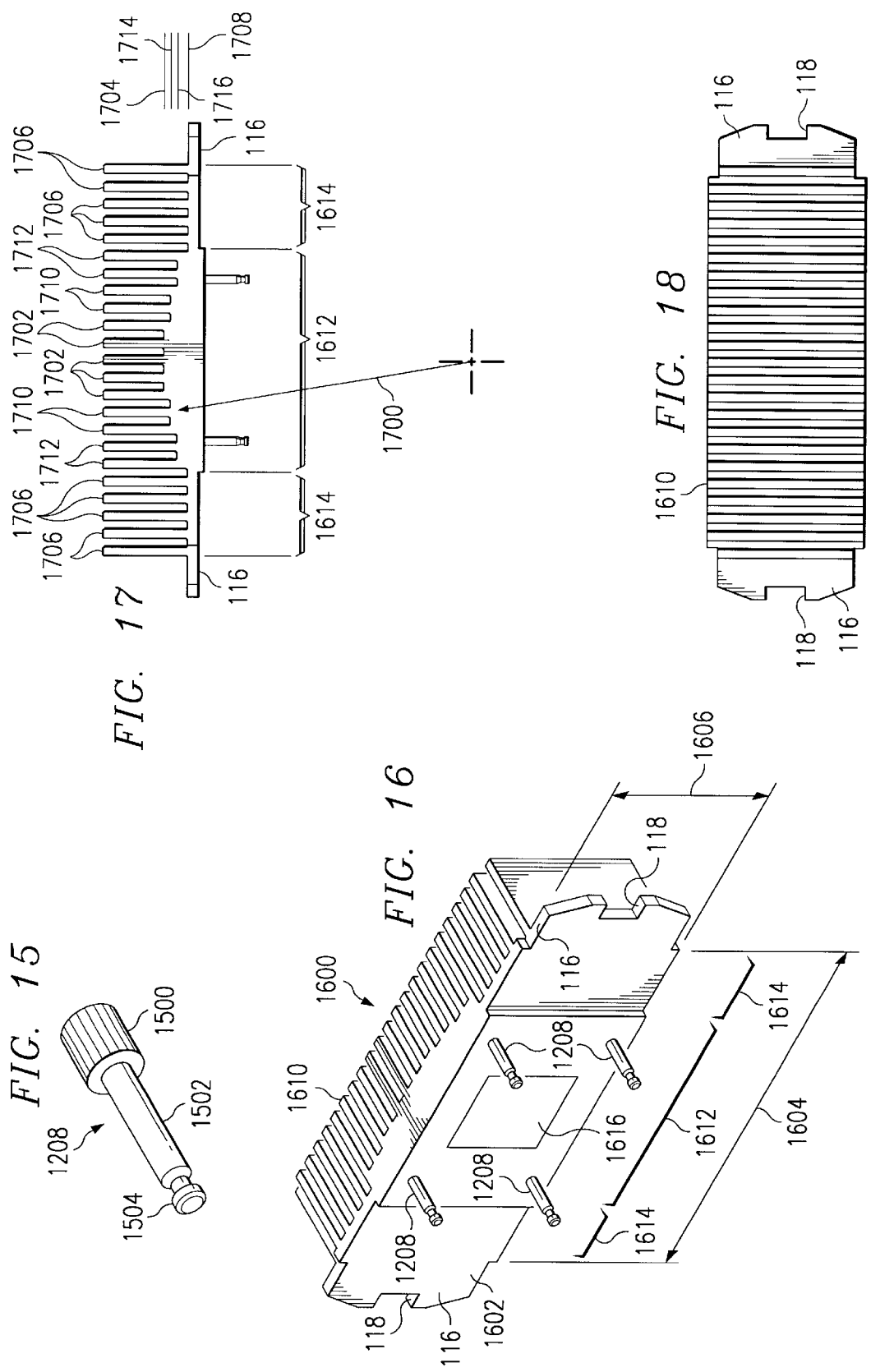

HEATSINK FOR ACTIVELY COOLED DAUGHTERBOARD SYSTEM

FIELD OF THE INVENTION

This invention relates generally to cooling techniques for electronic circuitry. More particularly, the invention relates to techniques for cooling electronic components that are mounted on a daughterboard.

BACKGROUND

Computer-related electronic systems are commonly constructed using multiple interconnected circuit boards. The largest of these circuit boards is typically called the motherboard. Ancillary circuit boards such as CPU cards, memory cards and input/output cards are typically called daughterboards. Sockets are provided on the motherboard for receiving one or more daughterboards and making appropriate electrical connections between components mounted on the daughterboards and those mounted on the motherboard. Such sockets are usually designed so that the daughterboards may be easily removed and replaced.

Special thermal management problems are presented by motherboard/daughterboard systems wherein high heat dissipation components are mounted on the daughterboards. Specifically, it has been found that fan-driven heat sinks are necessary to prevent the high heat dissipation components such as CPU chips on the daughterboards from overheating.

One example of such a motherboard/daughterboard system is described in the single edge contact cartridge ("SECC") packaging specifications promulgated by Intel Corporation. Referring now to FIG. 1, the packaging specification for boxed SECC2 processors describes a daughterboard 100 on which a CPU is mounted. Daughterboard 100 is adapted to engage a socket 102 on a motherboard 104 so that daughterboard 100 is oriented substantially perpendicular to motherboard 104. A heatsink 106 is disposed on one side of daughterboard 100 between the CPU and a fan 108. On the opposite side of daughterboard 100, an SECC2 cover plate 110 is provided to help anchor heatsink 106 to daughterboard 100. Heatsink 106 is generally rectangular and includes plural elongate fins 112. Each of fins 112 lies on a plane that is substantially parallel to motherboard 104. The axis of rotation of fan 108 is also substantially parallel to motherboard 104. A fan shroud 114 is provided to direct air flow through heatsink 106 from the ends of fins 110 to the middle of fins 110 under fan 108 as shown in FIG. 2.

Heatsink 106 also includes tabs 116 on either end. (Tabs 116 are best illustrated in FIG. 3.) Each of tabs 116 defines a notch 118 for engaging a retaining member of socket 102. An example of such a retaining member is universal retention mechanism 400 ("URM") shown in FIG. 4. URM 400 includes a frame with top surfaces 406 and a resilient arm 402. Resilient arm 402 includes retaining ledges 404. Typically, one URM 400 is disposed on each end of socket 102 with its retaining ledges 404 facing inward toward the socket. When daughterboard 100 is pushed into socket 102, notches 118 on either side of heatsink 106 engage the underside of ledges 404, thereby helping to retain daughterboard 100 in socket 102.

SUMMARY OF THE INVENTION

A heatsink for use with a daughterboard system may include plural transverse fins integrally formed with a base portion. The fins are parallel to one another, but are orthogonal relative to the bottom of the base portion. The fins have a constant profile relative to the bottom of the base portion, but the base portion has a central portion that is thicker than its end portions. The thickness of the central portion varies according to a radius. The radius is approximated by step differences in the depths of the fins.

BRIEF DESCRIPTION OF THE DRAWINGS

FIGS. 9 and 10 are exploded and assembled side views, respectively, of the daughterboard system of FIG. 5.

FIGS. 12, 13 and 14 are oblique, side and top plan views, respectively, of a first heatsink for optional use with the daughterboard system of FIG. 5.

FIG. 15 is an oblique view of a heatsink mounting pin.

FIGS. 16, 17 and 18 are oblique, side and top plan views, respectively, of a second heatsink according to a preferred embodiment of the invention.

DETAILED DESCRIPTION OF THE PREFERRED EMBODIMENTS

Figure 1:
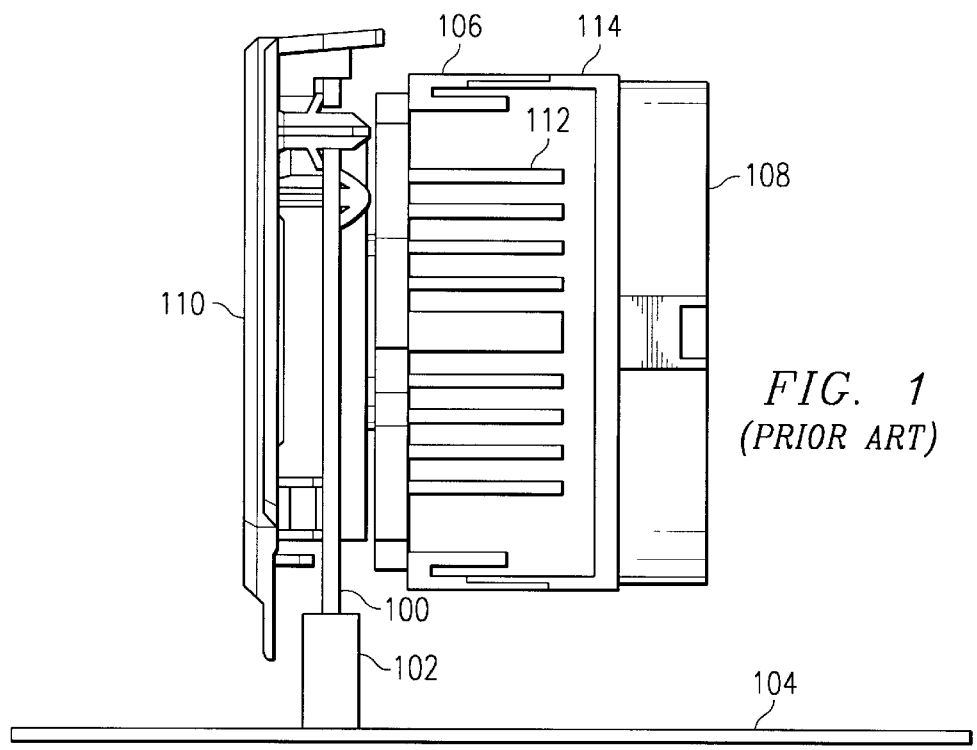
FIG. 1 is a side view of an actively-cooled daughterboard system according to the prior art.
Figure 2:
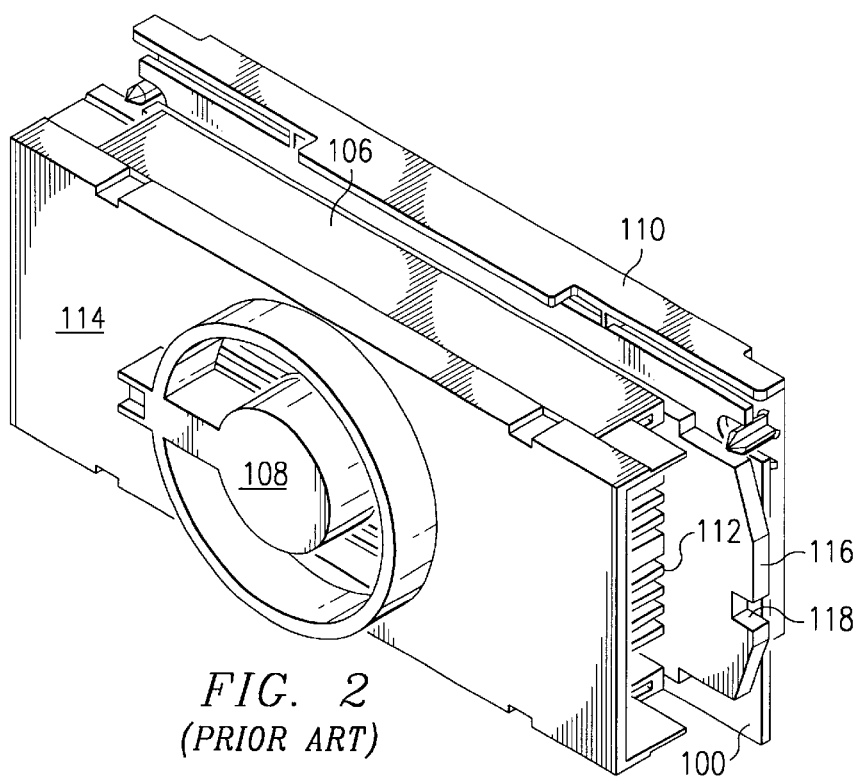
FIG. 2 is an oblique view of the daughterboard system of FIG. 1.
Figure 3:
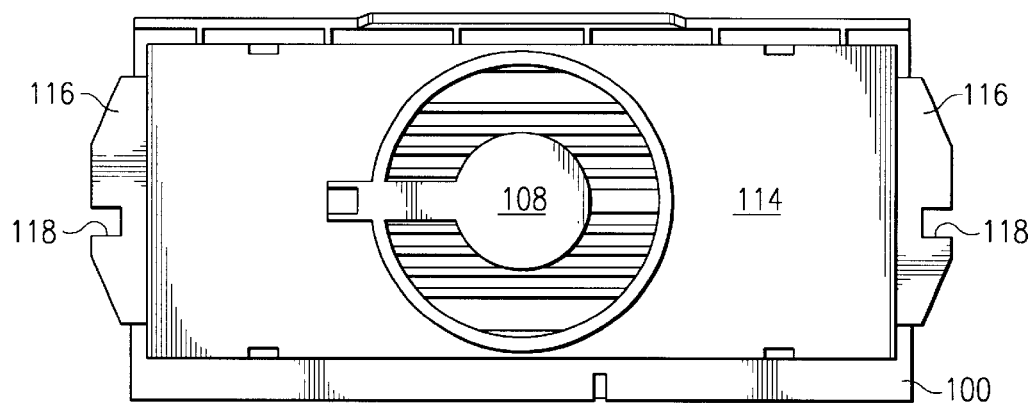
FIG. 3 is a top plan view of the daughterboard system of FIG. 1.
Figure 4:
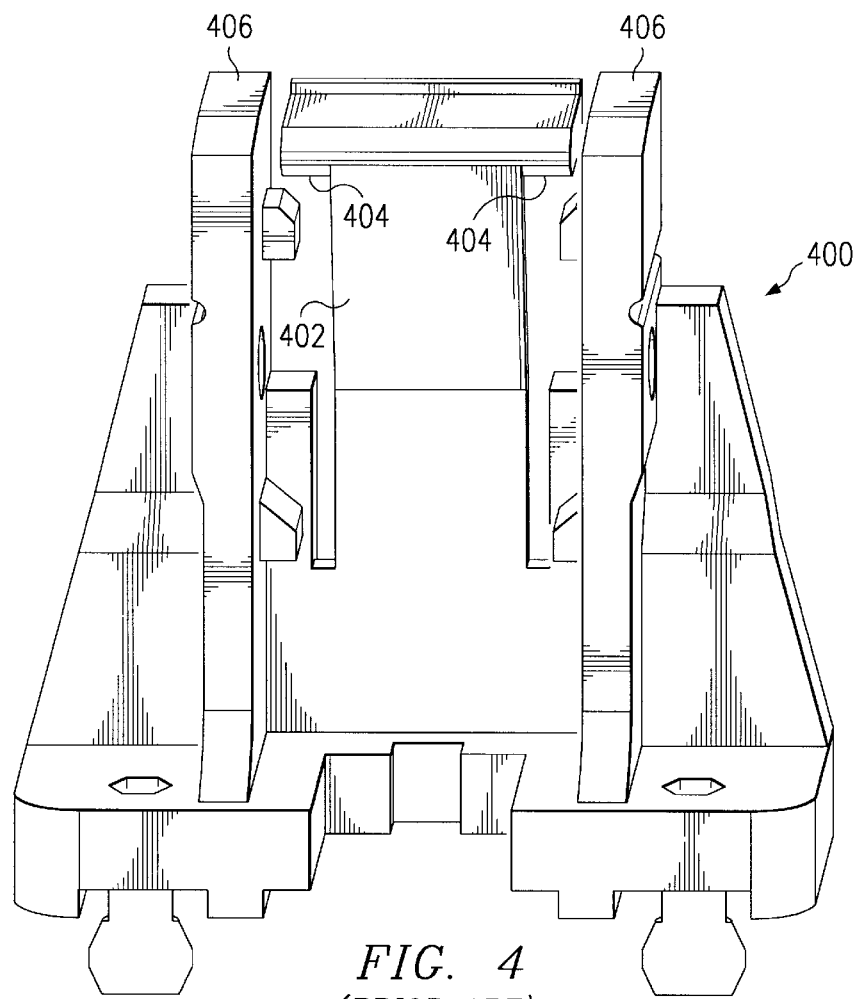
FIG. 4 is an oblique view of a daughterboard retaining mechanism according to the prior art.
Figure 5:
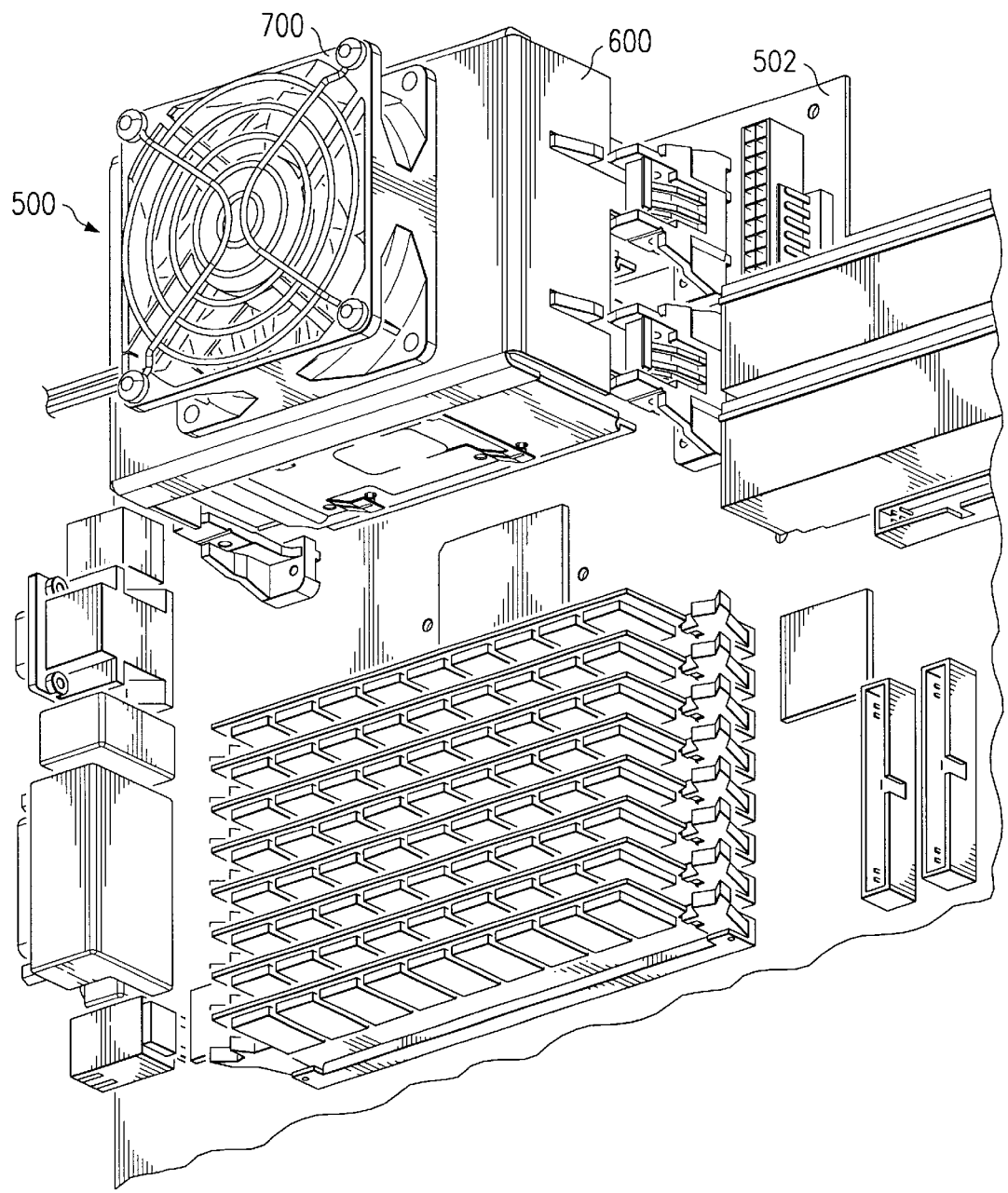
FIG. 5 is an oblique view of an actively cooled daughterboard system for optional use with a heatsink according to a preferred embodiment of the invention.

Actively cooled daughterboard system. FIG. 5 illustrates an actively cooled daughterboard system 500. In daughterboard system 500, one or more daughterboards are housed inside a fan shroud 600. (In the embodiment shown, two daughterboards are so housed.) Each daughterboard housed within shroud 600 has a heat generating component such as a CPU mounted on it, and each daughterboard assembly includes a heatsink that is thermally coupled to the heat generating component. Preferably, each heatsink includes a plurality of transverse fins (to be further described below) oriented so that air may pass between the fms in a direction generally parallel to the plane of the associated daughterboard. Active cooling is provided by a single fan 700 mounted on the top of shroud 600 as shown. Using a single fan in this manner eliminates the need for multiple fans located on the individual daughterboard assemblies.

Figure 6:
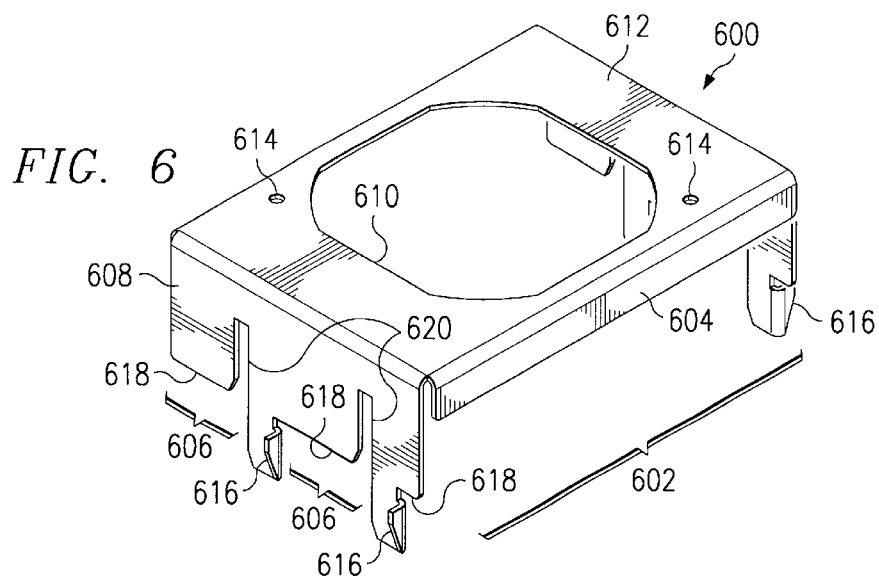
FIGS. 6, 7 and 8 are oblique, side and top plan views, respectively, of the fan shroud of FIG. 5.
Figure 7:
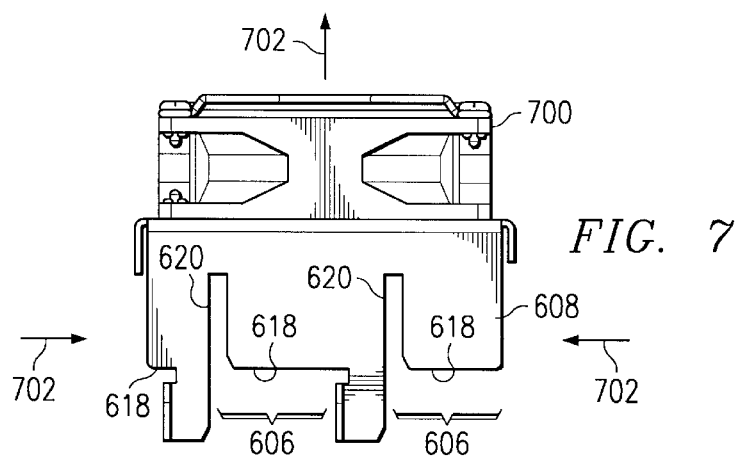
Figure 8:
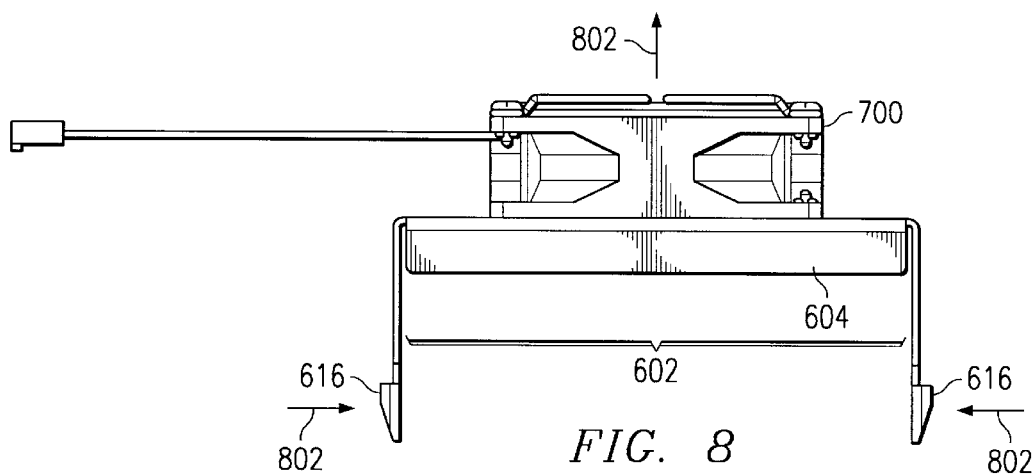

Fan shroud 600 is illustrated in more detail in FIGS. 6–8. Fan shroud 600 has openings 602 in both sides 604 and openings 606 in both ends 608. In addition, there is an opening 610 in top surface 612 underneath the footprint of fan 700. The purpose of openings 602, 604 and 610 is to direct air flow through the plural transverse fins of the heatsinks and through fan 700. Preferably, fan 700 is mounted on shroud 600 as shown in FIGS. 7 and 8 so that the axis of rotation of fan 700 is substantially parallel with planes of the daughterboards (and thus also parallel with the outer ends of the transverse fins of the heatsinks). When fan 700 is so oriented, air flow will occur generally in the direction indicated by arrows 702 (side intake, top effluent)

and 802 (end intake, top effluent). In alternative embodiments, the direction of the airflow may be reversed by changing the blow direction of fan 700.

In the embodiment shown, fan shroud 600 was constructed from a single sheet of aluminum alloy which was cut and then folded into the configuration shown. Alternative materials and construction methods may, of course, be employed. Fan 700 was mounted to the top of shroud 600 by inserting plastic rivets in mounting holes 614. Alternative mounting methods may be used.

Shroud 600 includes protrusions 616 on each end 608 for engaging retaining ledges 404 of retaining members 400. In addition, shroud 600 also includes shoulder portions 618 which act as insertion stops when shroud 600 is placed over the tops of the daughterboards. (Shoulder portions 618 engage the top surface of retaining members 400 to stop the movement of shroud 600 toward motherboard 502 as shroud 600 is being placed over the daughterboards.) Preferably, protrusions 616 should be disposed below shoulder portions 618 by a distance that will allow them to engage the undersides of retaining ledges 404 just before shoulders 618 contact the top surfaces of retaining members 404. In an embodiment, ends 608 were separated by a distance that was slightly smaller than the distance between retaining members 400. Such a spacing was adequate to enable protrusions 616 to engage retaining ledges 404 when shroud 600 was placed over the daughterboards.

Shroud 600 includes guide slots 620 on each end 608. Each of the heatsinks on the daughterboards includes end tabs 116. After the daughterboards have been installed into their sockets on motherboard 502 as shown in FIG. 9, notches 118 in end tabs 116 engage retaining ledges 404 on one end of ledges 404, leaving the other end of retaining ledges 404 free. Guide slots 620 are used to properly align shroud 600 over tabs 116 for installation as indicated by dashed lines 902. When slots 620 are disposed over tabs 116, protrusions 616 align themselves with the free end of retaining ledges 404. Shroud 600 is lowered into position until protrusions 616 engage the free end of retaining ledges 404 as shown in FIG. 10. It can be seen in FIG. 10 that shoulder portions 618 on shroud ends 608 act as insertion stops when they engage the top surfaces of retaining members 400.

Figure 11:
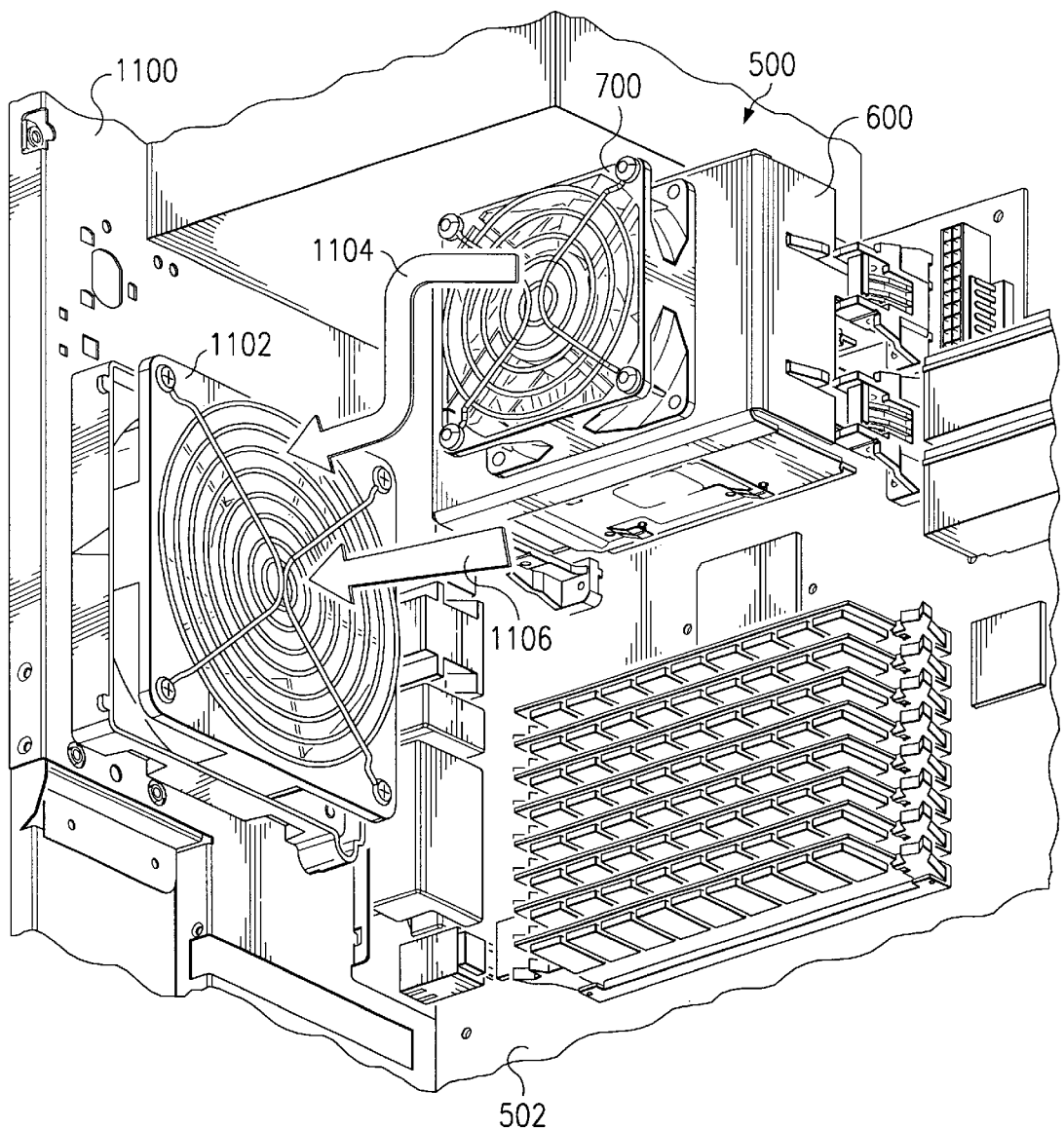
FIG. 11 is an oblique view of the daughterboard system of FIG. 5 housed in a host computer chassis according to a preferred embodiment of the invention.

Additional heat removal efficiency may be achieved by mounting daughterboard system 500 in a host computer chassis 1100 as shown in FIG. 11. In the configuration of FIG. 11, the effluent path 1104 of fan 700 is proximate to the intake path 1106 of a chassis ventilation fan 1102. This enables chassis fan 1102 to direct heat-containing effluent from daughterboard system 500 to the exterior of chassis 1100.

First preferred heatsink. A first preferred heatsink for optional use with daughterboard system 500 will now be described with reference to FIGS. 12–14. Heatsink 1200 was extruded using an aluminum 6063-T5 material. Other materials and fabrication techniques may be used. Heatsink 1200 includes a rectangular base portion 1202 having a longitudinal dimension 1204 longer than its transverse dimension 1206. Tabs 116 were cut on either end of the base portion, for engaging retaining members 400 disposed proximate to a socket of a motherboard 502. Four holes were drilled into the bottom of base portion 1202 for receiving mounting pins 1208 for anchoring heatsink 1200 to a daughterboard. Numerous transverse fins 1210 were integrally formed with base portion 1202 during extrusion. Fins 1210 were radially displaced from one another, as shown.

Base portion 1202 has end parts 1214 and a central part 1212. Central part 1212 is preferably disposed directly over the heat generating component(s) of the daughterboard, and is thicker than end parts 1214 to enhance heat removal effectiveness over the components. In the illustrated embodiment, the thickness of central part 1212 of base portion 1202 varies according to an inner radius 1300 of fins 1210. In one embodiment, inner radius 1300 was approximately 119.2 mm. The profile 1302 formed by the outer ends of fins 1210 varies according to an outer radius 1304. In one embodiment, outer radius 1304 was approximately 136.8 mm and was constant for each of fins 1210. The inner radius, however, was not constant for each of fins 1210. Specifically, inner radius 1306 (associated with the fins coupled to end parts 1214 of base portion 1202) was slightly longer than inner radius 1300 (associated with the fins coupled to central part 1212 of base portion 1202). Variation of the inner fin radius in this manner enables additional fins to be placed on heatsink 1200 while maintaining a constant outer radius 1302.

Preferably, central part 1212 of base portion 1202 is adapted to be coupled to the a heat generating component of the daughterboard. In one embodiment, this was accomplished by attaching a thermally conductive aluminum foil to the central area 1216 of the bottom of base 1202. One material that was found to be useful for this purpose is sold under the trademark THERMSTRATE, and is available from Foxcon, Inc. under the part number 081-0001-558.

Mounting pins 1208 are illustrated in more detail in FIG. 15. Each pin 1208 has a stem 1502 with a knurled cylindrical portion 1500 on one end and a clip retaining lip 1504 on the other end. During assembly, knurled portion 1500 is pressed into the previously-drilled receiving holes on the bottom of base 1202 of heatsink 1200 forming a friction fit. Clip retaining lips 1504 are used to secure heatsink 1200 to the daughterboard by means of a retaining clip. Retaining clips useful for this purpose are available from Foxcon, Inc. under the part number 025-0002-960. Other means may optionally be used to secure heatsink 1200 to the daughterboard.

Second preferred heatsink. A second preferred heatsink 1600 for use with daughterboard system 500 will now be described with reference to FIGS. 16–18. Heatsink 1600 was extruded using the same material as heatsink 1200. Other materials and fabrication techniques may be used. Heatsink 1600 includes a rectangular base portion 1602 having a longitudinal dimension 1604 longer than its transverse dimension 1606. Tabs 116 were cut on either end of the base portion, for engaging retaining members 400 disposed proximate to a socket of a motherboard 502. Four holes were drilled into the bottom of base portion 1602 for receiving mounting pins 1208 for anchoring heatsink 1600 to a daughterboard. Numerous transverse fins 1610 were integrally formed with base portion 1602 during extrusion. Fins 1610 are all parallel to each other and orthogonal to the bottom of base portion 1602.

Base portion 1602 has end parts 1614 and a central part 1612. The central part 1612 is thicker than the end parts 1614 to enhance heat removal over the heat generating components of the daughterboard. The thickness of central part 1612 of base portion 1602 varies according to a radius 1700. Radius 1700 may be approximated by step differences in the depths of fins 1610. For example, in the embodiment shown, five central fins 1702 are the shallowest depth 1704. Two groups of five endmost fins 1706 have the deepest depth 1708. And fin pairs 1710, 1712 have intermediate depths 1714, 1716, respectively. The profile formed by the outer ends of fins 1710 is constant relative to the bottom of the base portion 1602.

Like heatsink 1200, heatsink 1600 is preferably adapted to be coupled to a heat generating component of the daughterboard by attaching thermally conductive aluminum foil to the bottom of base 1602 in central area 1616. Also like heatsink 1200, pins 1208 may be used to secure heatsink 1600 to the daughterboard.

While the invention has been described in detail in relation to a preferred embodiment thereof, the described embodiment has been presented by way of example and not by way of limitation. It will be understood by those skilled in the art that various changes may be made in the form and details of the described embodiment without deviating from the spirit and scope of the invention as defined by the appended claims.

What is claimed is:

1. A heatsink, comprising:

a rectangular base portion having its longitudinal dimension larger than its transverse dimension;

tabs disposed on each longitudinal end of the base portion, the tabs for engaging retaining members disposed proximate to a socket of a motherboard;

at least one mounting pin for anchoring the heatsink to a daughterboard;

plural transverse fins integrally formed with the base portion, the fins oriented parallel to one another and orthogonal to the base portion;

wherein the base portion has end parts and a central part; and wherein the thickness of the central part is greater than the thickness of the end parts and is constant in the transverse direction but varies according to a radius in the longitudinal direction.

2. A heatsink according to claim 1, wherein:

the outer ends of the fins define a first plane that is substantially parallel with a second plane defined by a bottom surface of the base portion.

3. A heatsink according to claim 1, wherein:

a bottom surface of the central part of the base portion is adapted to be thermally coupled to a heat generating component of the daughterboard by contact engagement with the heat generating component.

4. A heatsink according to claim 1, wherein:

the at least one mounting pin is coupled to the base portion by means of a friction fit between a knurled portion of the mounting pin and a receiving hole in the base portion.

5. A heatsink according to claim 2, wherein:

a central group of fins is disposed over the central part of the base portion; and the lengths of the fins in the central group vary approximately according to the radius.

6. A heatsink according to claim 5, wherein:

at least two adjacent fins in the central group have the same length.

7. A heatsink according to claim 5, wherein:

three adjacent fins in the central group have a first length.

8. A heatsink according to claim 7, wherein:

two adjacent fins in the central group have a second length different from the first length and are disposed on one side of the three adjacent fins, and two additional adjacent fins in the central group have the second length and are disposed on the other side of the three adjacent fins.

9. A heatsink according to claim 8, wherein:

two adjacent fins in the central group have a third length different from the first and second lengths and are disposed on one side of the three adjacent fins, and two additional adjacent fins in the central group have the third length and are disposed on the other side of the three adjacent fins.

* * * * *